United States Patent
Chen et al.

(10) Patent No.: US 12,376,252 B2
(45) Date of Patent: Jul. 29, 2025

(54) AUTOMATIC TOOLLESS ADJUSTMENT DESIGN FOR GRAPHICS ADD-IN CARD RETENTION

(71) Applicant: DELL PRODUCTS L.P., Round Rock, TX (US)

(72) Inventors: HsienWei Chen, New Taipei (TW); Yu-Tai Sheng, Taipei (TW); Pei-Yi Chou, Taipei (TW); Che-Ling Huang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 266 days.

(21) Appl. No.: 18/185,597

(22) Filed: Mar. 17, 2023

(65) Prior Publication Data
US 2024/0314959 A1    Sep. 19, 2024

(51) Int. Cl.
H05K 7/14    (2006.01)
G06F 1/18    (2006.01)

(52) U.S. Cl.
CPC ........... H05K 7/1402 (2013.01); G06F 1/186 (2013.01)

(58) Field of Classification Search
CPC .............................. H05K 7/1402; G06F 1/186
USPC ......................................................... 361/801
See application file for complete search history.

(56) References Cited

U.S. PATENT DOCUMENTS

| | | | | |
|---|---|---|---|---|
| 5,575,546 A * | 11/1996 | Radloff | ................... | G06F 1/186 361/740 |
| 5,601,349 A * | 2/1997 | Holt | ........................ | G06F 1/184 174/67 |
| 6,215,668 B1 * | 4/2001 | Hass | ........................ | G06F 1/186 361/801 |
| 6,442,038 B1 * | 8/2002 | Erickson | .................. | G06F 1/186 361/801 |
| 6,674,650 B1 * | 1/2004 | Davis | ....................... | G06F 1/185 361/752 |
| 7,161,798 B2 | 1/2007 | Chen et al. | | |
| 2004/0170007 A1 * | 9/2004 | Chen | .................... | H05K 7/1408 361/801 |
| 2005/0059285 A1 * | 3/2005 | Chen | .................... | H05K 7/1408 439/325 |
| 2005/0276025 A1 * | 12/2005 | Beall | ....................... | G06F 1/184 361/752 |
| 2007/0004264 A1 * | 1/2007 | Brown | .................... | G06F 1/185 439/351 |
| 2009/0273900 A1 * | 11/2009 | Liu | .......................... | G06F 1/186 361/679.58 |
| 2012/0020037 A1 * | 1/2012 | Chiu | ....................... | G06F 1/185 361/759 |
| 2024/0260221 A1 * | 8/2024 | Tsorng | ................. | H05K 7/1487 |

* cited by examiner

*Primary Examiner* — Zhengfu J Feng

(74) *Attorney, Agent, or Firm* — Larson Newman, LLP

(57) ABSTRACT

A retention mechanism is provided for retaining graphics add-in cards in an information handling system. The retention mechanism includes a mount and a retention bracket. The mount is affixed to the information handling system and includes mounting locations. The retention bracket is configured to be affixed to a particular one of the mounting locations and includes an adjustable filler device. The filler device is configured to secure a first graphics add-in card having a first width with the filler device located in a first position, and to secure a second graphics add-in card having a second width that is wider than the first width with the filler device located in a second position.

20 Claims, 5 Drawing Sheets

AUTOMATIC TOOLLESS ADJUSTMENT DESIGN FOR GRAPHICS ADD-IN CARD RETENTION

FIELD OF THE DISCLOSURE

This disclosure generally relates to information handling systems, and more particularly relates to providing an automatic toolless adjustment design for a graphics add-in card retention device in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A retention mechanism may be provided for retaining graphics add-in cards in an information handling system. The retention mechanism may include a mount and a retention bracket. The mount may be affixed to the information handling system and may include a plurality of mounting locations. The retention bracket may be configured to be affixed to a particular one of the plurality of mounting locations and may include an adjustable filler device. The filler device may be configured to secure a first graphics add-in card having a first width with the filler device located in a first position, and to secure a second graphics add-in card having a second width that is wider than the first width with the filler device located in a second position.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures as needed or desired.

Figure 1:
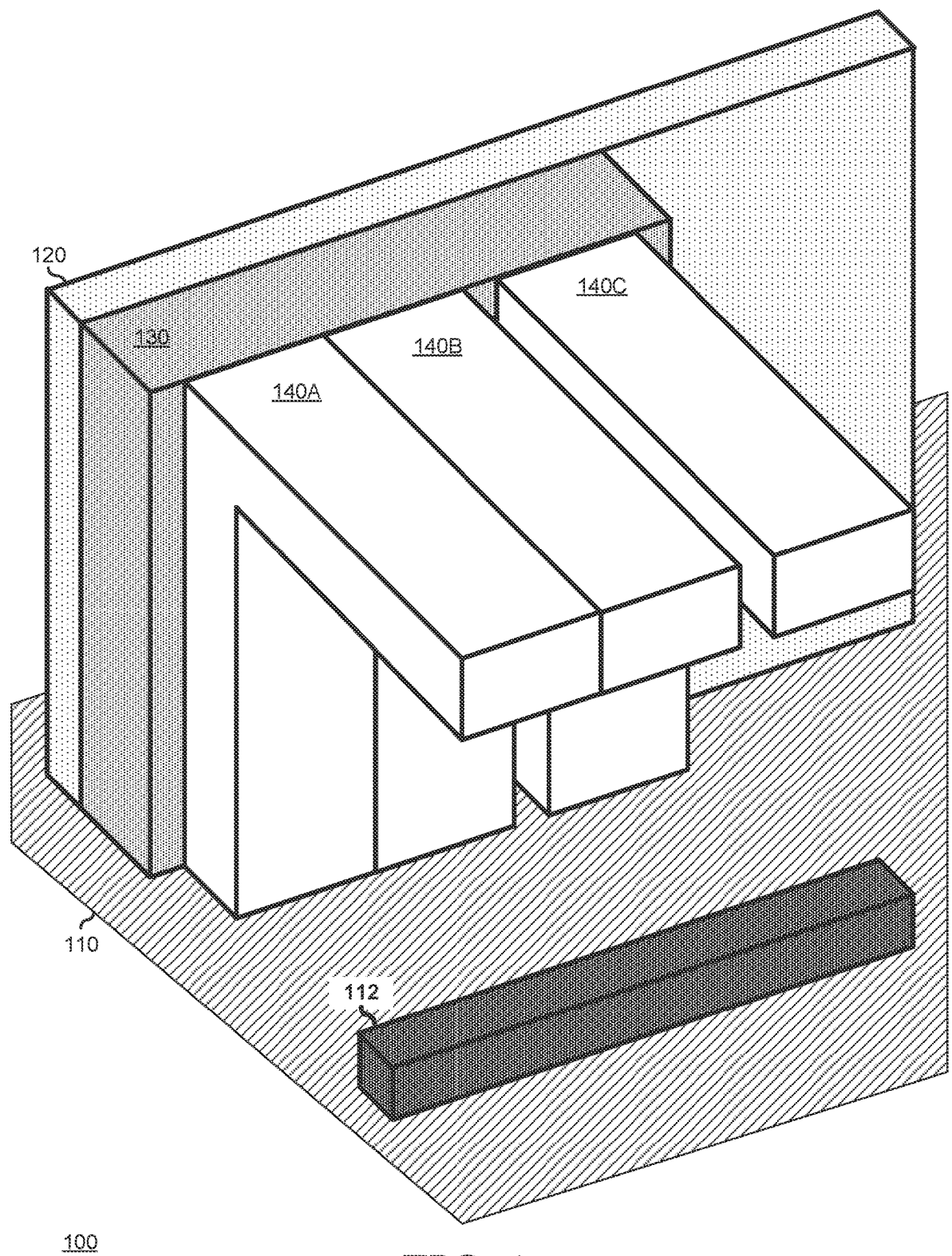
FIG. 1 is an illustration of the interior of an information handling system having a graphics add-in card retainer mechanism according to an embodiment of the current disclosure.

FIG. 1 illustrates the interior of an information handling system 100. Information handling system 100 represents a full-featured computing system that is housed in a standard sized enclosure, such as a desktop computer, a tower computer, a stand-alone server or workstation, or the like. Information handling system 100 includes a motherboard 110 with one or more PCIe connectors 112, a frame member 120 to which a graphics card retainer bracket mount 130 is affixed. PCIe connector 112 represents a connector that is electrically and mechanically affixed to motherboard 110. PCIe connector 112 may accommodate full sized PCIe add-in cards, supporting multiple link widths (for example ×4, ×8, ×16), and multiple form factors. A standard full length PCIe add-in card may have a form factor of 111.15× 312.00/20 0.32 (mm), and PCIe add-in cards fit within the full length form factor, or smaller PCIe add-in cards may be accommodated within information handling system 100 without special mounting fixtures.

Information handling system 100 is further configured to accommodate other non-standard PCIe add-in cards, such as graphics add-in cards. In particular graphics add-in cards, in addition to having various heights and lengths that are typically within the profile of the standard full-length, may have various non-standard widths. Because graphics add-in cards typically support one or more graphics processors that require higher power and that generate greater amounts of heat, graphics add-in cards may be provided with one or heat sink and cooling fan to remove the excess heat from the graphics add-in card. Thus graphics add-in cards may have widths of up to three (3) slot widths (i.e., 60 mm) to accommodate the additional components. It has been understood that, due to the added components of graphics add-in cards, the typical PCIe socket may not provide sufficient mechanical support for graphics add-in cards. For this reason, when an information handling system is provided with a graphics add-in card, the information handling system is typically provided with a graphics add-in card retention bracket that is affixed to mount to provide additional mechanical support for the graphics add-in card.

Because of the wide variety in graphics add-in card form factors, the manufacturer of information handling systems must typically stock multiple different types of brackets, each different type being associated with a different graphics add-in card form factor. Moreover, each of the various graphics add-in cards may have a different location along its length that is the optimal location to place a bracket, adding to the variety of brackets needed to accommodate the expected usage of graphics add-in cards. Thus, for example, a manufacturer of information handling systems may typically stock dozens of different styles of graphics add-in card retention brackets.

Figure 2:
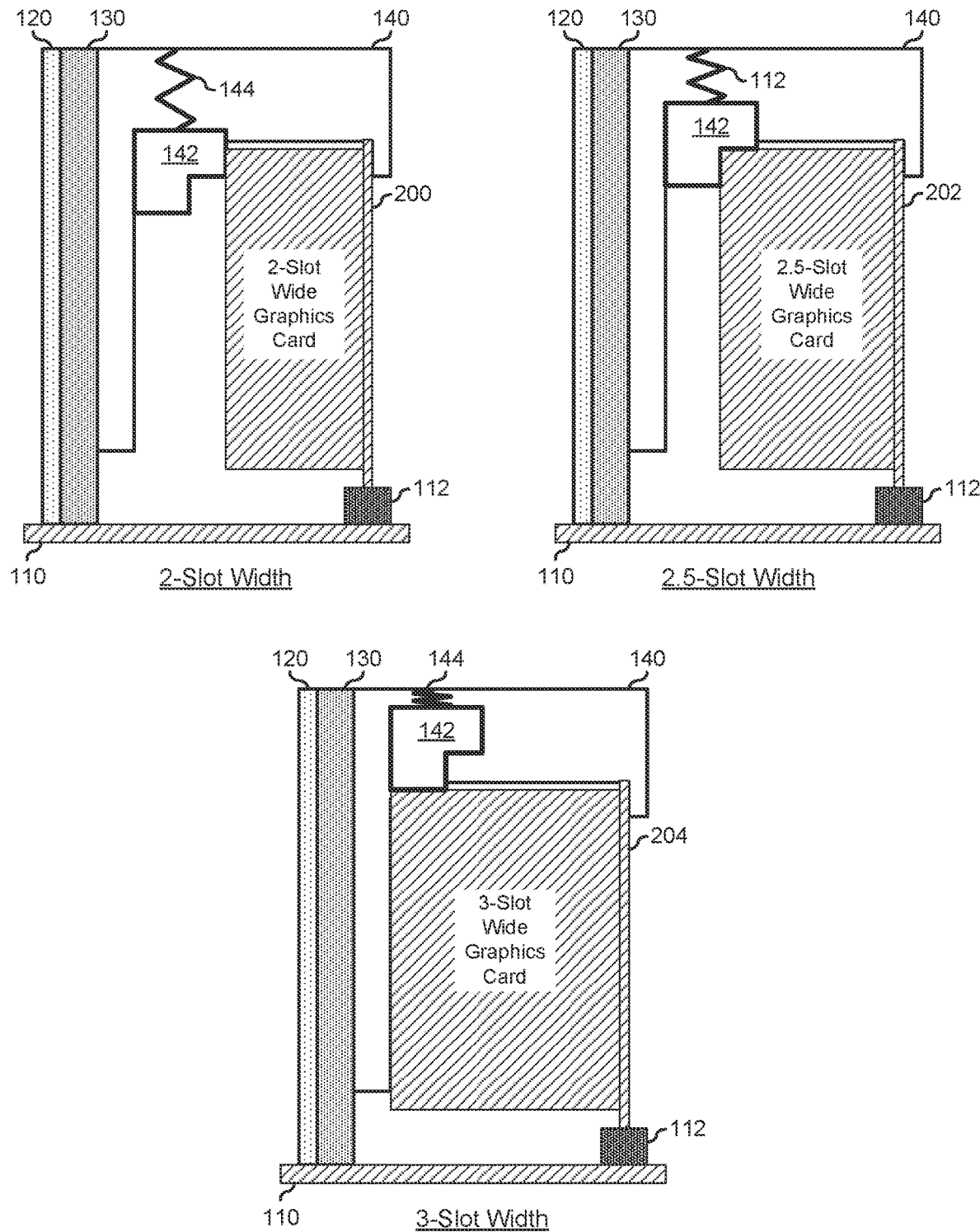
FIG. 2 is an illustration of the information handling system of FIG. 1 showing the retention of various graphics add-in cards.
Figure 3:
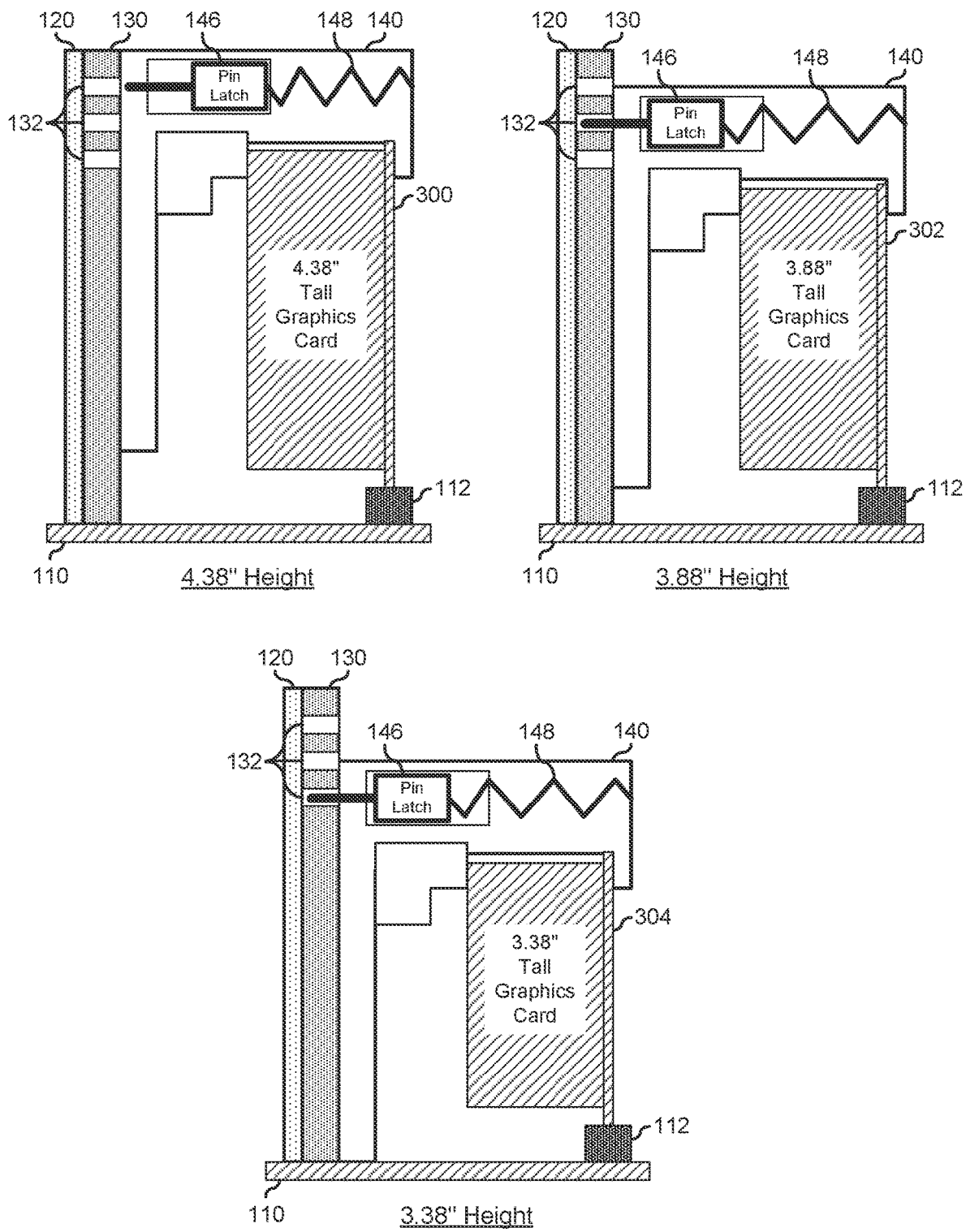
FIG. 3 is another illustration of the information handling system of FIG. 1 showing the retention of various other graphics add-in cards.
Figure 4:
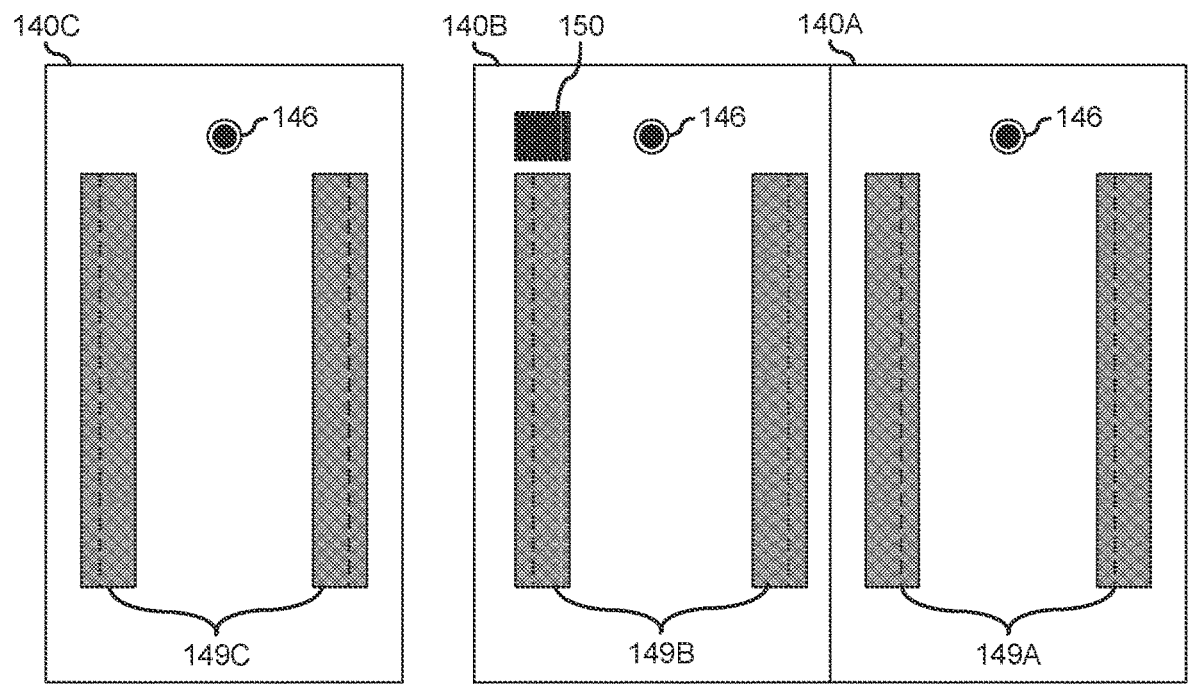
FIG. 4 is an illustration of retention brackets of the information handling system of FIG. 1 showing a keyed arrangement.

When information handling system 100 is provided with a graphics add-in card, the information handling system may be installed with an automatic toolless graphics add-in card retention bracket 130. In particular, retention bracket 140 provides for the automatic and toolless adjustment to various graphics add-in card widths, as illustrated in FIG. 2. Retention bracket 140 further provides for the automatic and toolless adjustment to various graphics add-in card heights, as illustrated in FIG. 3. Finally, retention bracket 140 is provided in three (3) keyed variants (retention bracket 140A, retention bracket 140B, and retention bracket 140C) that each provide for retention of graphics add-in cards at various locations along the length of the graphics add-in cards, and that positively restrict each variant to a specific location on mount 140, as illustrated in FIG. 4.

FIG. 2 illustrates three (3) usages of retention bracket 140 for the automatic and toolless adjustment to fit graphics add-in cards of varying widths. Retention bracket 140 is illustrated as including a movable adjustment filler 142 that is preloaded to a downward position by a spring 144. Filler 142 has a stepped profile with one or more steps, each step for accommodating a different graphics add-in card width. As illustrated, filler 142 has two (2) steps. In a first usage, information handling system 100 has a graphics add-in card 200 installed that has a 2 slot width (i.e., 40 mm). Retention bracket 140 is installed from above graphics add-in card 200, and filler 142 is not engaged with the graphics add-in card, but is fit snugly against an edge of a first step of the filler to securely retain the graphics add-in card. In a next usage, information handling system 100 has a graphics add-in card 202 installed that has a 2.5 slot width (i.e., 50 mm). When retention bracket 140 is installed from above graphics add-in card 202, the added width of the graphics add-in card engages with the first step of filler 142, and the filler is pushed upward into the body of retention bracket 140 against the pressure of spring 144.

Graphics add-in card 202 is thus fit snugly against an edge of a second step of filler 142 to securely retain the graphics add-in card. In a third usage, information handling system 100 has a graphics add-in card 204 installed that has a 3 slot width (i.e., 60 mm). When retention bracket 140 is installed from above graphics add-in card 204, the added width of the graphics add-in card engages with the second step of filler 142, and the filler is pushed further upward into the body of retention bracket 140 against the pressure of spring 144. Graphics add-in card 204 is thus fit snugly against an edge of retention bracket 140 to securely retain the graphics add-in card. A filler such as filler 142 may have fewer than or greater than two (2) steps, as needed or desired.

FIG. 3 illustrates three (3) usages of retention bracket 140 for the automatic and toolless adjustment to fit graphics add-in cards of varying heights. Retention bracket 140 is illustrated as including a movable pin/latch 146 that is preloaded by a spring 148 such that a pin portion of the pin/latch can extend into one of three (3) holes 132 in mount 130. Holes 132 are located at various heights of mount 130. With the pin portion of pin/latch 146 extended into the one of holes 132, retention bracket 140 is prevented from moving upward or downward. However, when pin/latch 146 is slid in a track against the pressure of spring 148, the pin portion of the pin/latch is withdrawn to clear mount 130, as illustrated in the top-left usage, so that the retention bracket is free to move downward to engage with a graphics add-in card. In a first usage, information handling system 100 has a graphics add-in card 300 installed that has an exemplary 4.38" height (that is, a full height add-in card).

Retention bracket 140 is installed from above graphics add-in card 300 with pin/latch 146 slid to clear the pin portion from interfering with mount 130. When retention bracket 140 engages with graphics add-in card 300, pin/latch 146 is pushed into a top hole 132 by spring 148 to securely retain the graphics add-in card. In a next usage, information handling system 100 has a graphics add-in card 302 installed that has an exemplary 3.88" height. When retention bracket 140 is installed with pin/latch 146 slid to clear the pin portion from interfering with mount 130, the retention bracket engages with graphics add-in card 302, and pin/latch 146 is pushed into a middle hole 132 by spring 148 to securely retain the graphics add-in card. In a third usage, information handling system 100 has a graphics add-in card 304 installed that has an exemplary 3.38" height. When retention bracket 140 is installed with pin/latch 146 slid to clear the pin portion from interfering with mount 130, the retention bracket engages with graphics add-in card 304, and pin/latch 146 is pushed into a bottom hole 132 by spring 148 to securely retain the graphics add-in card. A mount such as mount 130 may have fewer than or greater than three (3) holes at different heights, as needed or desired.

FIG. 4 illustrates retention brackets 140A, 140B, and 140C, in an exemplary arrangement. Retention brackets 140A, 140B, and 140C are viewed from the direction of mount 130, and illustrate where each variant is keyed to provide for retention of graphics add-in cards at various locations along the length of the graphics add-in cards, and that positively restrict each variant to a specific location on the mount. Each of retention brackets 140A, 140B, and 140C include respective guide rails 149A, 149B, and 149C. In a particular embodiment, the profiles and arrangements of guide rails 149A, 149B, and 149C operate to restrict retention brackets 140A, 140B, and 140C to their respective locations with respect to mount 130. In this regard, mount 130 have complimentary guide rails associated with the locations of retention brackets 140A, 140B, and 140C, as described below.

Guide rails 149A, 149B, and 149C are each illustrated with a dashed line. A portion of each guide rail associated with a smaller side of the guide rail demarked by the dashed line is representative of a spine portion of the guide rail, and a larger side portion is representative of a flange portion of the guide rail. In this regard, guide rail 149A has outward-facing flanges, while guide rails 149B and 149C have inward-facing flanges. As such, a location on mount 130 associated with retention bracket 140A will have complimentary guide rails with inward-facing flanges, such that the retention bracket is securely affixed to the mount. Further, another location on mount 130 associated with retention bracket 140B will have complimentary guide rails with outward-facing flanges, such that retention bracket 140B is securely affixed to the mount, and yet another location on the mount associated with retention bracket 140C will have complimentary guide rails with outward-facing flanges, such that retention bracket 140C is securely affixed to the mount. Thus neither retention bracket 140B nor retention bracket 140C will have guide rails that are complimentary with the guide rails on mount 130 that are associated with retention bracket 140A, and only retention bracket 140A will fit into the location associated with retention bracket 140A.

Further, both retention brackets 140B and 140C have respective inward-facing guide rails 149B and 149C, and mount 130 has associated complimentary guide rails associated the respective locations of retention brackets 140B and 140C. However, guide rails 149B are spaced more closely together than guide rails 149C. In this way, neither retention bracket 140B nor retention bracket 140C will fit into the location on mount 130 that is associated with the other retention bracket.

Figure 5:
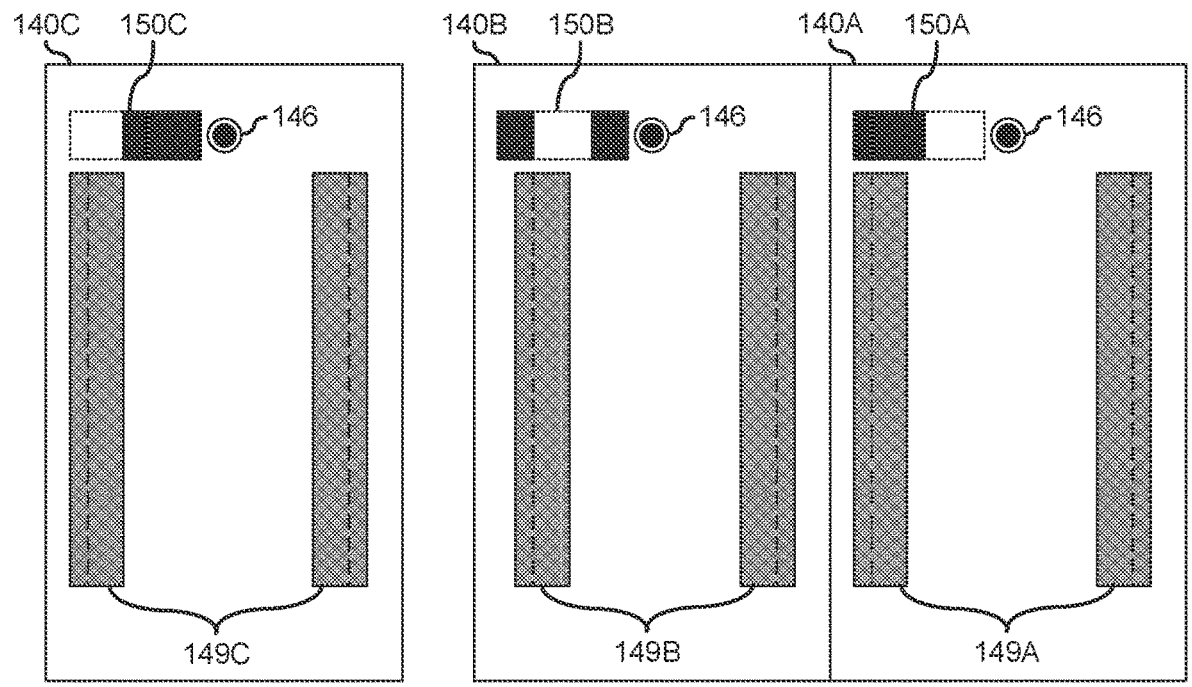
FIG. 5 is another illustration of retention brackets of the information handling system of FIG. 1 showing another keyed arrangement.

In another embodiment, the guide rails associated with each one of retention brackets 140A, 140B, and 140C have common orientations (inward-facing vs. outward-facing) and common spacings, but one or more flange on either the retention bracket or mount 130 has a different depth, thereby preventing mis-locating of the retention brackets with respect to their associated locations on the mount. In another embodiment, illustrated in FIG. 5, guide rails 149A, 149B, and 149C have a common inward-facing orientation, but one guide rail of each pair is uniquely located for its associated retention brackets 140A, 140B, and 140C. Here retention brackets 140A, 140B, and 140C each have a respective and unique key barrier 150A, 150B, and 150C that blocks the guide rails of misplaced retention brackets from being affixed to mount 130. Various combinations of guide rail arrangements, flange orientations and depths, key barrier arrangements, or other features to uniquely affix a particular retention bracket to an associated location on a mounting flange, or combinations thereof, may be utilized in conjunction with the teachings of this disclosure. Further, retention brackets provided in accordance with the teachings of this disclosure may utilize any combination of fillers, pin/latches, guide rails, key barriers, or the like, as needed or desired. The utilization on a single retention bracket of a filler, a pin/latch, a guide rail, and a key barrier may provide an optimum configuration, as needed or desired. Note that the arrangements of guide rails as depicted in FIGS. 4 and 5 show common spacing between retention brackets 140A, 140B, and 140C, but this is not necessarily so, and the various retention brackets may have a varying guide rail spacing as needed or desired.

Figure 6:
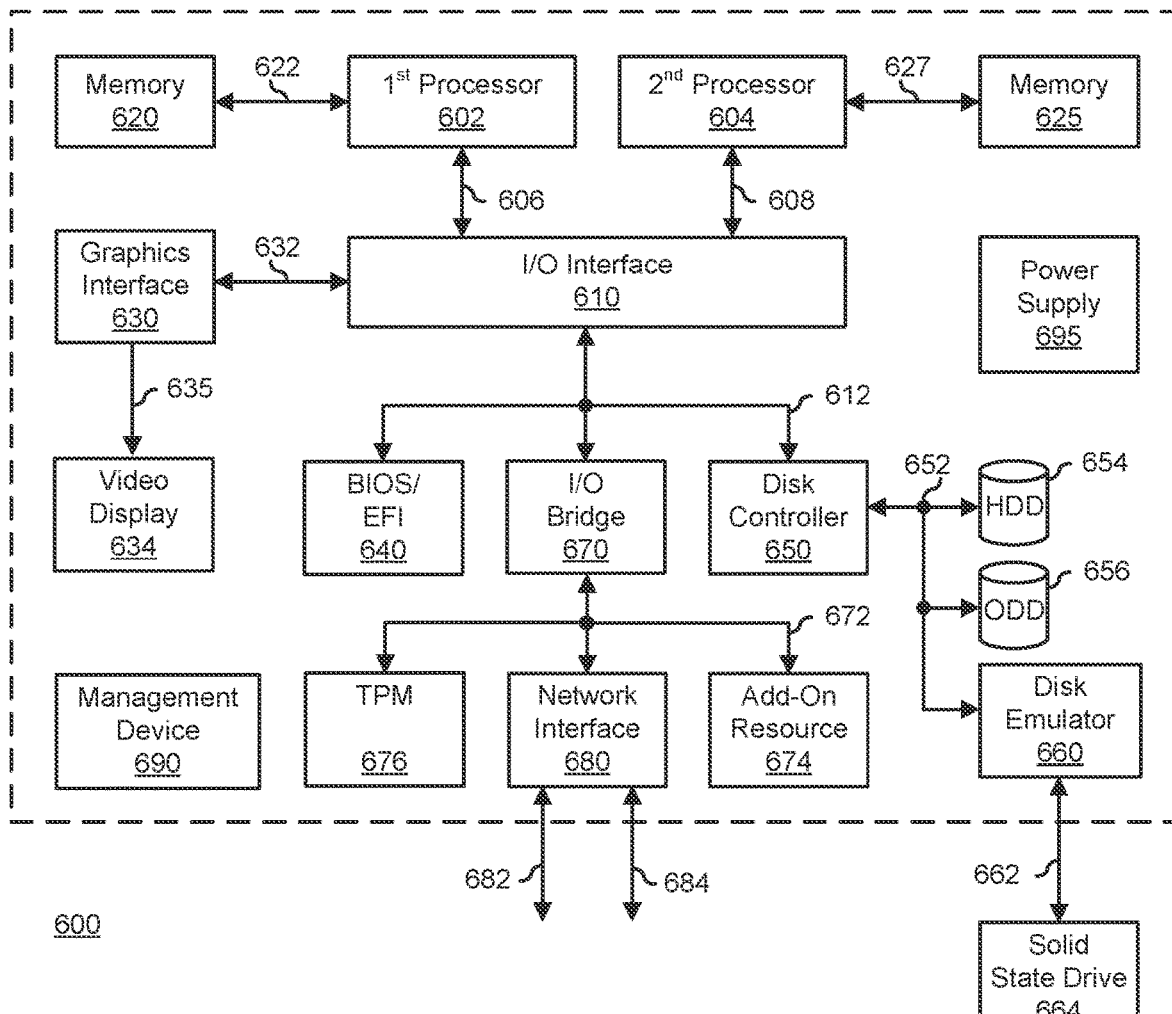
FIG. 6 is a block diagram illustrating a generalized information handling system according to another embodiment of the present disclosure.

FIG. 6 illustrates a generalized embodiment of an information handling system 600. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620 and 625, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632, and provides a video display output 635 to a video display 634. In a particular embodiment, information handling system 600 includes separate memories that are dedicated to each of processors 602 and 604 via separate memory interfaces. An example of memories 620 and 625 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612, or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on a separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600. Management device 690 can operate off of a separate power plane from the components of the host environment so that the management device receives power to manage information handling system 600 when the information handling system is otherwise shut down. An example of management device 690 includes a commercially available BMC product or other device that operates in accordance with an Intelligent Platform Management Initiative (IPMI) specification, a Web Services Management (WS-Man) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A retention mechanism for retaining graphics add-in cards in an information handling system, the retention mechanism comprising:
    a mount affixed to the information handling system, the mount including a plurality of mounting locations; and
    a retention bracket configured to be affixed to a particular one of the plurality of mounting locations and including an adjustable filler device, wherein the filler device is configured to secure a first graphics add-in card having a first width with the filler device located in a first position, and to secure a second graphics add-in card having a second width that is wider than the first width with the filler device located in a second position.

2. The retention mechanism of claim 1, wherein the filler device is further configured to secure a third graphics add-in card having a third width that is wider than the second width with the filler device located in a third position.

3. The retention mechanism of claim 2, wherein the retention bracket further includes a spring configured to engage the filler device.

4. The retention mechanism of claim 3, wherein, when the retention bracket is retaining the first graphics add-in card, the spring retains the filler device in a first position, when the retention bracket is retaining the second graphics add-in card, the spring retains the filler device in a second position, and when the retention bracket is retaining the third graphics add-in card, the spring retains the filler device in a third position.

5. The retention mechanism of claim 1, wherein:
each mounting location includes a plurality of adapter holes, wherein, for each mounting location, each adapter hole is located at a different height;
and the retention bracket further includes an adapter pin, wherein the pin is configured to lock the retention bracket to a third graphics add-in card having a first height by engaging into a first adapter hole, and to lock the retention bracket to a fourth graphics add-in card having a second height that is lower than the first height by engaging into a second adapter hole that is lower than the first adapter hole.

6. The retention mechanism of claim 5, wherein the adapter pin is further configured to lock the retention bracket to a fifth graphics add-in card having a third height that is lower than the second height by engaging into a third adapter hole that is lower than the second adapter hole.

7. The retention mechanism of claim 6, wherein the retention bracket further includes a spring configured to engage the adapter pin.

8. The retention mechanism of claim 7, wherein, when the retention bracket is being affixed to the mount, the pin is pushed against the spring to clear the mount, and when the retention bracket is fit to the third graphics add-in card, the spring drives the pin into the first adapter hole.

9. The retention mechanism of claim 1, wherein:
each mounting location includes a keyed attachment mechanism; and
the retention bracket includes a complimentary attachment mechanism that is keyed to the particular mounting location.

10. The retention mechanism of claim 9, wherein the keyed attachment mechanism includes a unique slide rail arrangement for each mounting location.

11. The retention mechanism of claim 9, wherein the keyed attachment mechanism includes a unique key barrier arrangement for each mounting location.

12. A method for retaining graphics add-in cards in an information handling system, the method comprising:
affixing a mount to the information handling system;
providing, on the mount, a plurality of mounting locations;
affixing a retention bracket to a particular one of the plurality of mounting locations;
providing, on the retention bracket, an adjustable filler device, wherein the filler device is configured to secure a first graphics add-in card having a first width with the filler device located in a first position, and to secure a second graphics add-in card having a second width that is wider than the first width with the filler device located in a second position.

13. The method of claim 12, wherein the filler device is further configured to secure a third graphics add-in card having a third width that is wider than the second width with the filler device located in a third position.

14. The method of claim 13, further comprising providing, on the retention bracket, a spring configured to engage the filler device, wherein, when the retention bracket is retaining the first graphics add-in card, the spring retains the filler device in a first position, when the retention bracket is retaining the second graphics add-in card, the spring retains the filler device in a second position, and when the retention bracket is retaining the third graphics add-in card, the spring retains the filler device in a third position.

15. The method of claim 12, further comprising:
providing, at each mounting location, a plurality of adapter holes, wherein, for each mounting location, each adapter hole is located at a different height; and
providing, on the retention bracket, an adapter pin, wherein the pin is configured to lock the retention bracket to a third graphics add-in card having a first height by engaging into a first adapter hole, and to lock the retention bracket to a fourth graphics add-in card having a second height that is lower than the first height by engaging into a second adapter hole that is lower than the first adapter hole.

16. The method of claim 15, wherein the adapter pin is further configured to lock the retention bracket to a fifth graphics add-in card having a third height that is lower than the second height by engaging into a third adapter hole that is lower than the second adapter hole.

17. The method of claim 16, further comprising providing, on the retention bracket, a spring configured to engage the adapter pin, wherein, when the retention bracket is being affixed to the mount, the pin is pushed against the spring to clear the mount, and when the retention bracket is fit to the third graphics add-in card, the spring drives the pin into the first adapter hole.

18. The method of claim 12, further comprising providing, on each mounting location, a keyed attachment mechanism, wherein the retention bracket includes a complimentary attachment mechanism that is keyed to the particular mounting location.

19. The method of claim 18, wherein the keyed attachment mechanism includes one of a unique slide rail arrangement for each mounting location and a unique key barrier arrangement for each mounting location.

20. An information handling system, comprising:
a motherboard configured to receive a graphics add-in card; and
a retention mechanism for retaining the graphics add-in card, the retention mechanism including:
a mount affixed to the information handling system, the mount including a plurality of mounting locations; and
a retention bracket affixable to a particular one of the plurality of mounting locations and including an adjustable filler device, wherein when the graphics add-in card has a first width, the filler device is configured to secure the graphics add-in card with the filler device located in a first position and, when the graphics add-in card has a second width that is wider than the first width, the filler device is configured to secure the graphics add-in card with the filler device located in a second position.

* * * * *